Oct. 31, 1961 L. S. CUTLER 3,007,117

BLOCKING OSCILLATOR REGENERATIVE FREQUENCY DIVIDER WITH AUXILIARY EXCITING CIRCUIT

Filed Aug. 15, 1958

LEONARD S. CUTLER
INVENTOR

BY [signature]

ATTORNEYS

United States Patent Office 3,007,117

Patented Oct. 31, 1961

3,007,117

BLOCKING OSCILLATOR REGENERATIVE FREQUENCY DIVIDER WITH AUXILIARY EXCITING CIRCUIT

Leonard S. Cutler, Palo Alto, Calif., assignor to Hewlett-Packard Company, Palo Alto, Calif., a corporation of California Filed Aug. 15, 1958, Ser. No. 755,191
2 Claims. (Cl. 331—51)

Figure 1:
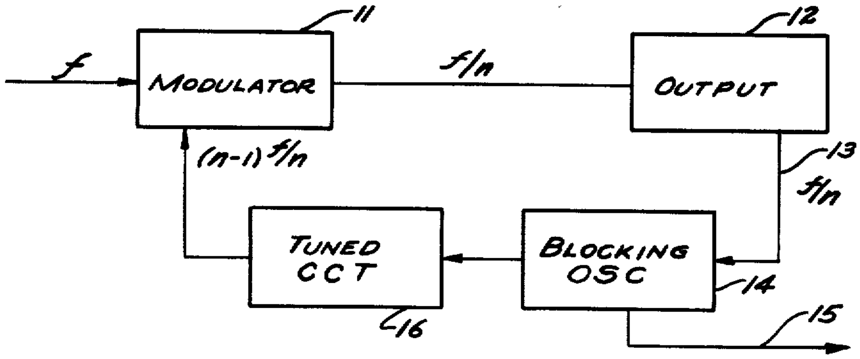

This invention relates generally to a frequency divider and more particularly to a regenerative frequency divider.

As is well known, frequency division is important in frequency measurement work to provide low frequency oscillations having the same precision as a standard high frequency source, such as a crystal oscillator. Dividers employing pentagrid mixers provide high impedance output which is relatively void of harmonics. In many applications, it is desirable to have a low frequency output having high harmonic content whereby a plurality of low signal frequency oscillations may be obtained.

It is an object of the present invention to provide a regenerative divider having a high level, low impedance output.

It is another object of the present invention to provide a regenerative frequency divider having a low frequency output signal which is rich in harmonics.

It is still another object of the present invention to provide a regenerative divider which includes a modulator and a blocking oscillator.

These and other objects of the invention will become more clearly apparent from the following description when taken in conjunction with the accompanying drawing.

Figure 2:
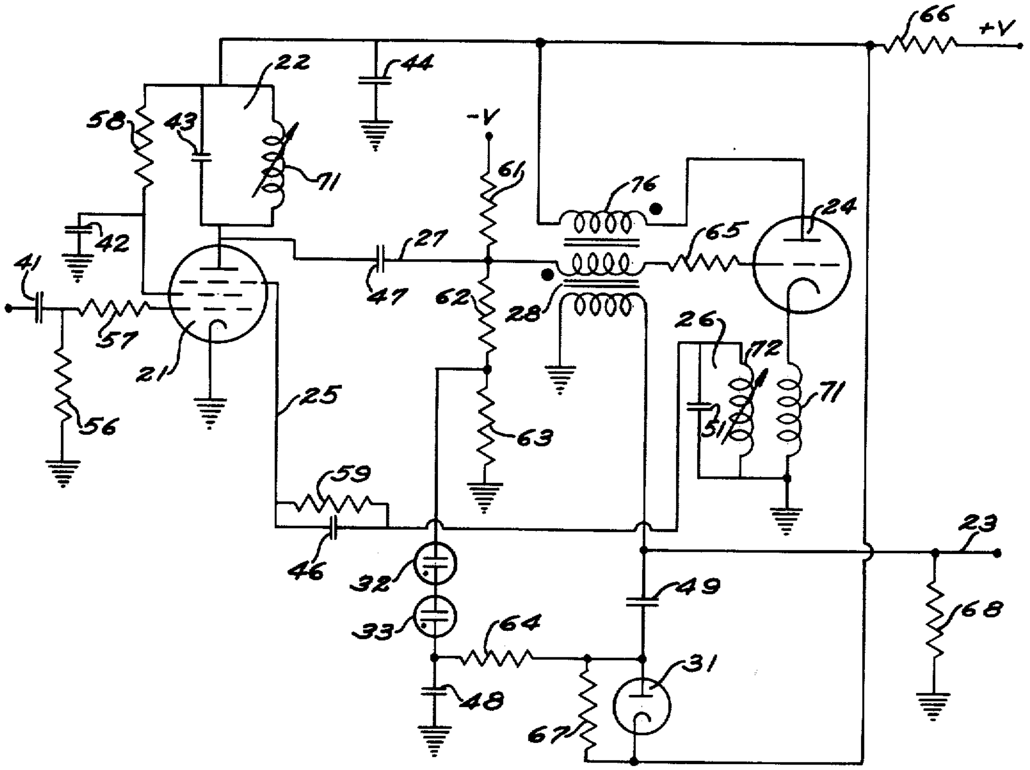

Referring to the drawing:

FIGURE 1 is a block diagram of a regenerative frequency divider in accordance with the invention; and FIGURE 2 is a detailed circuit diagram of a frequency divider in accordance with the invention.

The oscillations of standard frequency designated by signal $f$ are applied to the input of a modulator 11. The output of the modulator is applied to an output circuit 12 which is tuned to the desired low frequency. For example, as illustrated, the output of the modulator has a frequency equal to $f/n$ where $n$ is an integer greater than 1. The output circuit 12 is tuned to this frequency and a signal of frequency $f/n$ is obtained on the line 13. This signal is applied to trigger or synchronize a blocking oscillator 14. The blocking oscillator feeds a tuned circuit 16 which is tuned to the frequency $(n-1)f/n$. The output of the tuned circuit 16 is combined with the input signal of frequency $f$ in the modulator 11 to form a difference frequency having the frequency $f/n$.

The blocking oscillator is triggered during each cycle and provides a high level output pulse to the modulator. This high level pulse, in general, is of sufficient amplitude to form high level signals which are rich in harmonics. Thus, the output signal on the line 15 includes the frequency $f/n$ plus harmonics thereof. Suitable tuned circuits may be connected to the line 15 to select the various harmonics to give a plurality of low frequencies which have a stability comparable to the input frequency $f$.

Referring to FIGURE 2, a detailed circuit diagram of a suitable regenerative divider including a blocking oscillator is shown. The input signal is capacitively coupled to the pentagrid mixer 21. The plate of the pentagrid mixer is connected to a tuned circuit 22 which is tuned to the sub-multiple frequency $f/n$. The plate of the mixer is also connected to the grid of the tube 24 which is connected as in a blocking oscillator circuit.

The sub-multiple frequency $f/n$ serves to trigger and synchronize the blocking oscillator. The cathode of the tube 24 is connected to a tuned circuit 26 which is tuned to the frequency $(n-1)f/n$. A signal is fed back along the line 25 to another of the grids of the pentagrid mixer whereby the input signals are mixed and the difference frequency excites the tuned circuit 22. The output signal appears on the line 23 and is coupled off of the line 27 by the transformer coupling 28.

When initially starting the frequency divider, the blocking oscillator is not operating and, consequently, there is no division of frequency. Thus, means are provided for exciting the blocking oscillator to form a feedback signal and cause the mixing action to take place. The circuit for this purpose includes the diode 31 with the associated circuit elements, and the neon tubes 32 and 33. Operation of the triggering or exciting circuit is as follows. When the regenerative divider is not working, there is no signal on load 23. Consequently, rectifier tube 31 has no signal applied to its plate and it produces no rectified voltage across resistor 67. Full voltage $+V$ is applied to the combination of neons 32, 33, resistor 64 and capacitor 48. Capacitor 48 charges in a positive direction until sufficient voltage appears across the neons to ignite them. When the neons ignite, capacitor 48 discharges producing a sharp positive pulse across resistor 63. This pulse is of sufficient amplitude to cause the blocking oscillator to undergo a cycle of operation. If the input signal is present at the pentagrid mixer, operation will commence and the divider will sustain itself, the blocking oscillator being synchronized by the output of the pentagrid mixer.

The circuit combination of capacitor 48, neons 32 and 33, and resistor 64 functions as a relaxation oscillator, and the circuit repeatedly supplies pulses to fire the blocking oscillator if the divider is not operating. Once operation has commenced, rectifier 31 produces a negative voltage across the combination of resistor 64, neons 32, 33 and capacitor 48 so that the neons cannot fire and produce pulses which would disturb operation of the divider.

Apparatus was constructed in accordance with the foregoing in which the various components and voltages had the following values:

| | | |
|---|---|---|
| Voltages: | | |
| +V | volts | +210 |
| −V | do | −195 |
| Tubes: | | |
| 21 | | 6AS6 |
| 24 | | 12AU7 |
| 31 | | 6AL5 |
| 32 and 33 | | NE2 |
| Capacitors: | | |
| 41 | mmf | 100 |
| 42 | mf | .01 |
| 43 | mmf | 500 |
| 44 | mf | .1 |
| 46 | mmf | 400 |
| 47 | do | 75 |
| 48 | mf | .03 |
| 49 | do | .001 |
| 51 | mmf | 120 |
| Resistors: | | |
| 56 | ohms | 470K |
| 57 | do | 100 |
| 58 | do | 15K |
| 59 | do | 100K |
| 61 | do | 620K |
| 62 | do | 42K |
| 63 | do | 22K |
| 64 | megohms | 10 |

Resistors:

| | | |
|---|---|---|
| 65 | ohms | 100 |
| 66 | do | 22K |
| 67 | megohms | 4.7 |
| 68 | ohms | 10K |

Inductors:

| | | |
|---|---|---|
| 71 | mh | 3.5 |
| 72 | do | 260 |

A circiut constructed in accordance with the foregoing was operated with a one megacycle signal of 2 volts amplitude applied to the input terminal. The output signal obtained was a 100 volt, 100 kc. signal. The 100 kc. output signal contained substantial second and third harmonic components whereby signals of 200 and 300 kc. could be obtained with tuned circuits. The output impedance was approximately 10 k. ohms.

Thus, it is seen that an improved regenerative divider is provided. The divider provides a high level output signal which is rich in harmonics at a low impedance level.

I claim:

1. A regenerative frequency divider comprising a modulator connected to receive an input signal of frequency $f$, an output circuit tuned to the frequency $f/n$, where $n$ is an integer greater than one, connected to receive the output of the modulator, a blocking oscillator operating at the frequency $f/n$ connected to be triggered by the output of the modulator, a circuit tuned to the frequency $(n \pm 1)f/n$ connected to be excited by the blocking oscillator, means for supplying the frequency $(n \pm 1)f/n$ to the modulator from the tuned circuit, output means connected to the output of the blocking oscillator, and an exciting circuit connected to said blocking oscillator and adapted to excite the same in the absence of output signals.

2. A regenerative frequency divider comprising a mixer including plate, at least first and second grid and cathode elements connected to receive an input signal of frequency $f$ at one of said grids, an output circuit tuned to the frequency $f/n$, where $n$ is an integer greater than one, connected to the plate of the tube, a blocking oscillator operating at the frequency $f/n$ connected to the plate of the tube and adapted to be triggered by the signal appearing thereon, a circuit tuned to the frequency $(n \pm 1)f/n$ connected to be excited by the blocking oscillator, means for supplying a signal frequency $(n \pm 1)f/n$ to the second grid from the tuned circuit, output means connected to the output of the blocking oscillator, and an exciting circuit connected to said blocking oscillator and adapted to excite the same in the absence of output signals.

References Cited in the file of this patent

UNITED STATES PATENTS

| | | |
|---|---|---|
| 2,257,663 | Albercht | Sept. 30, 1941 |
| 2,344,678 | Crosby | Mar. 21, 1944 |
| 2,464,259 | Proskauer | Mar. 15, 1949 |
| 2,484,763 | Sturm | Oct. 11, 1949 |
| 2,562,952 | Russell et al. | Aug. 7, 1951 |